(12) United States Patent
Myroth et al.

(10) Patent No.: US 8,120,206 B2
(45) Date of Patent: Feb. 21, 2012

(54) METHOD OF DETECTING A SUSTAINED PARALLEL SOURCE CONDITION

(75) Inventors: Jeffrey D. Myroth, Roscoe, IL (US); Vijay K. Maddali, Rockford, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 360 days.

(21) Appl. No.: 12/207,587

(22) Filed: Sep. 10, 2008

(65) Prior Publication Data

US 2010/0060288 A1 Mar. 11, 2010

(51) Int. Cl.
*H02J 1/00* (2006.01)
*H02J 3/00* (2006.01)

(52) U.S. Cl. ............... 307/71; 307/68; 307/87; 322/20; 322/22

(58) Field of Classification Search .................. None
See application file for complete search history.

(56) References Cited

U.S. PATENT DOCUMENTS

| | | | | |
|---|---|---|---|---|
| 2,872,591 A * | 2/1959 | Stineman | ...................... | 290/4 R |
| 2,986,647 A | 5/1961 | Britten | | |
| 3,683,199 A * | 8/1972 | Billings et al. | .................. | 307/87 |
| 3,748,493 A * | 7/1973 | Billings et al. | .................... | 327/3 |
| 4,251,735 A | 2/1981 | Coleman | | |
| 4,255,700 A * | 3/1981 | Takeda | .......................... | 323/210 |
| 4,301,408 A * | 11/1981 | Paddison et al. | ............... | 324/141 |
| 4,320,306 A * | 3/1982 | Kohga et al. | ..................... | 307/51 |
| 4,620,157 A | 10/1986 | Hayashi | | |
| 4,639,848 A | 1/1987 | Sakai | | |
| 4,695,736 A | 9/1987 | Doman et al. | | |
| 4,772,802 A | 9/1988 | Glennon et al. | | |
| 5,077,485 A | 12/1991 | Rashid | | |
| 5,153,498 A | 10/1992 | Parro | | |
| 5,349,676 A * | 9/1994 | Garverick et al. | ............... | 712/36 |
| 5,619,406 A * | 4/1997 | Divan et al. | ..................... | 363/98 |
| 5,731,688 A * | 3/1998 | Thomson | ......................... | 322/22 |
| 5,886,417 A | 3/1999 | Oka et al. | | |
| 6,118,678 A * | 9/2000 | Limpaecher et al. | ........... | 363/60 |
| 6,218,813 B1 * | 4/2001 | Davis | ............................... | 322/20 |
| 6,522,030 B1 | 2/2003 | Wall et al. | | |
| 6,624,535 B2 | 9/2003 | Morrow | | |
| 6,657,322 B2 * | 12/2003 | Skibinski et al. | ............. | 307/105 |
| 6,657,416 B2 | 12/2003 | Kern et al. | | |
| 6,664,653 B1 | 12/2003 | Edelman | | |
| 7,091,702 B2 * | 8/2006 | Mrowiec et al. | ................ | 322/36 |
| 2002/0110007 A1 | 8/2002 | Kalman et al. | | |
| 2003/0057926 A1 | 3/2003 | Huggett et al. | | |
| 2003/0197431 A1 * | 10/2003 | Lathrop et al. | ................ | 307/125 |

(Continued)

FOREIGN PATENT DOCUMENTS

DE 3620439 12/1987

(Continued)

OTHER PUBLICATIONS

European Search Report dated Dec. 23, 2009.

*Primary Examiner* — Jared Fureman
*Assistant Examiner* — Justen Fauth
(74) *Attorney, Agent, or Firm* — Carlson, Gaskey & Olds

(57) ABSTRACT

A method of detecting a parallel source condition includes calculating a reactive power, comparing the reactive power to a predetermined threshold, and determining a parallel source condition in response to the reactive power exceeding the predetermined threshold.

23 Claims, 4 Drawing Sheets

U.S. PATENT DOCUMENTS

| | | |
|---|---|---|
| 2006/0060396 A1 | 3/2006 | Rozman |
| 2007/0139019 A1* | 6/2007 | Wiegman et al. ............... 322/19 |
| 2008/0150496 A1 | 6/2008 | Yasuda et al. |

FOREIGN PATENT DOCUMENTS

| | | |
|---|---|---|
| DE | 3730138 | 3/1989 |
| EP | 0044528 | 1/1982 |
| EP | 0052256 | 5/1982 |
| EP | 1317057 | 6/2003 |
| EP | 1427082 | 6/2004 |
| EP | 1798836 | 6/2007 |
| GB | 2142491 | 1/1985 |
| JP | 57182179 | 11/1982 |

* cited by examiner

US 8,120,206 B2

METHOD OF DETECTING A SUSTAINED PARALLEL SOURCE CONDITION

BACKGROUND OF THE INVENTION

This application relates to reactive power, and more particularly to using negative reactive power to detect a sustained parallel source condition.

A vehicle, such as an aircraft, may contain multiple electrical generators coupled to a load. While it is possible to configure electrical generators to operate in parallel, such a parallel configuration can involve complex control algorithms. In an electrical system that includes multiple electrical generators not configured to operate in parallel, a fault condition, such as a contactor erroneously closing, may occur that causes the generators to be connected in parallel, resulting in a sustained parallel source ("SPS") condition. An SPS condition may also be referred to as a sustained unlike sources in parallel ("SUSP") or inadvertent parallel ("IP") condition. An SPS condition can have undesirable effects, such as motoring, which is when a first generator provides current to a second generator causing the second generator to act as a load and consume power instead of generating current, which can potentially damage the second generator.

Some AC circuits, such as those having inductor loads, dissipate zero power, but still appear to dissipate power as they can provide a voltage drop and can draw current. The power that appears to be delivered to such a load is known as "apparent power." Apparent power is a vector sum of real power and reactive power. Reactive power is measured in Volt-Amps-Reactive ("VAR").

SUMMARY OF THE INVENTION

A method of detecting a parallel source condition includes calculating a reactive power, comparing the reactive power to a predetermined threshold, and determining a parallel source condition in response to the reactive power exceeding the predetermined threshold.

A parallel source condition detection system includes a first generator coupled to a load, a second generator coupled to the load, and a controller. The controller is operable to determine a reactive power associated with at least one of the first generator and the second generator, to compare the reactive power to a predetermined threshold, and to determine a parallel source condition in response to the reactive power exceeding the predetermined threshold.

These and other features of the present invention can be best understood from the following specification and drawings, the following of which is a brief description.

DETAILED DESCRIPTION OF THE PREFERRED EMBODIMENT

Figure 1:
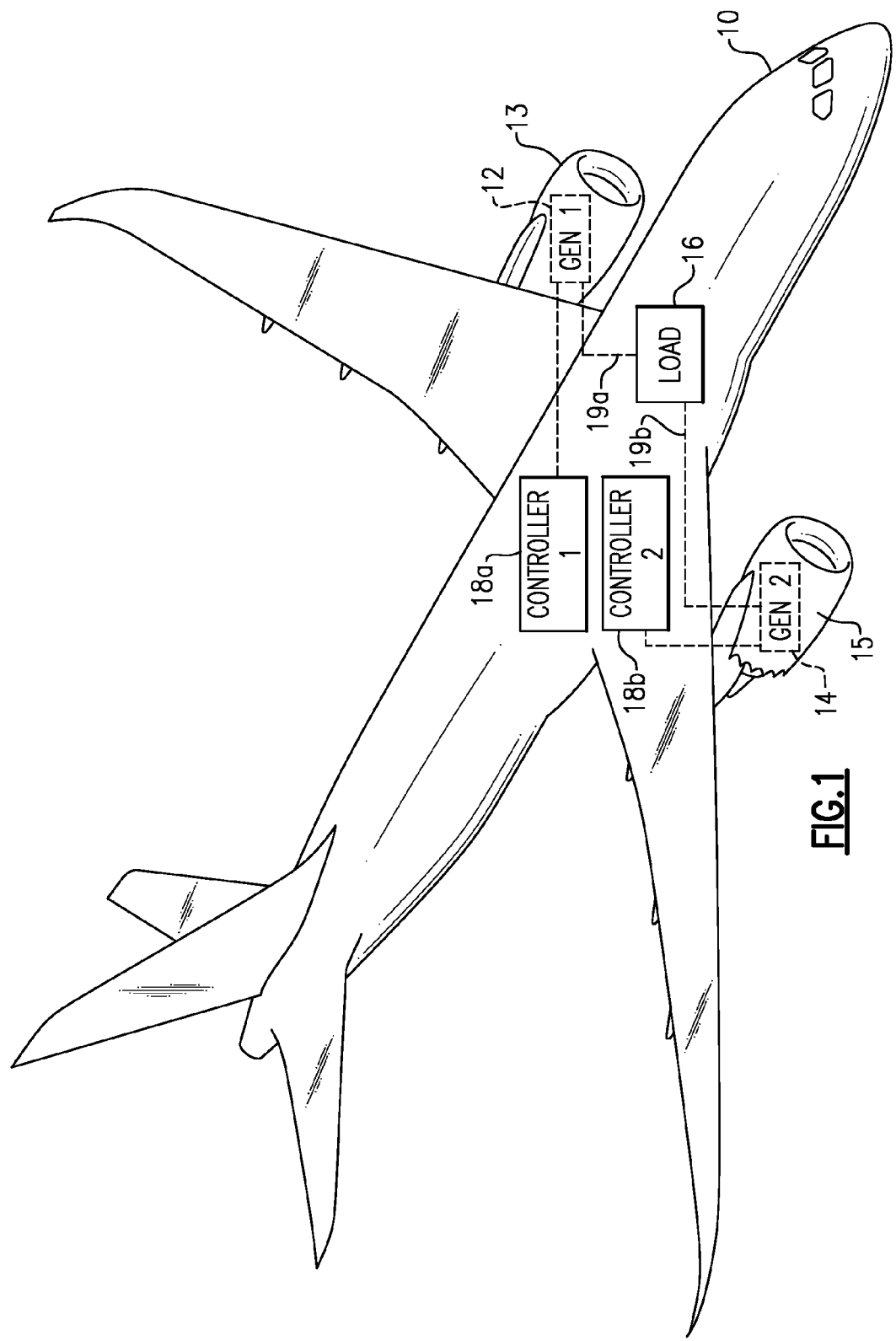
FIG. 1 schematically illustrates a vehicle system.

FIG. 1 schematically illustrates an aircraft 10 that includes a first generator 12 associated with a first turbine engine 13 and a second generator 14 associated with a second turbine engine 15. Although the aircraft 10 has been schematically illustrated to include a single generator 12, 14 associated with each turbine engine 13, 15, it is understood that a location of the generators 12, 14 is not limited to just these positions and that the generators 12, 14 could be applied to other locations. In one example both generators 12, 14 are associated with a single turbine engine. In one example at least one of the generators 12, 14 is associated with an aircraft Auxiliary Power Unit ("APU"). In one example the source of power being protected is an External Power ("EP") cart instead of a generator.

Each generator 12, 14 is coupled to a load 16 via an electrical bus network 19a, 19b. A first controller 18a is operable to process signals from the first generator 12 and is operable to control a flow of current from the first generator 12 to the load 16 via bus network 19a. The second controller 18b is operable to process signals from the second generator 14 and is operable to control a flow of current from the second generator 14 to the load 16 via bus network 19b. In one example each of the controllers 18a, 18b includes a digital signal processor ("DSP") to assist in signal processing. Each controller 18a, 18b is operable to measure a current and a voltage of its associated generator 12, 14 in order to calculate a reactive power associated with the associated generator 12, 14.

Figure 2:
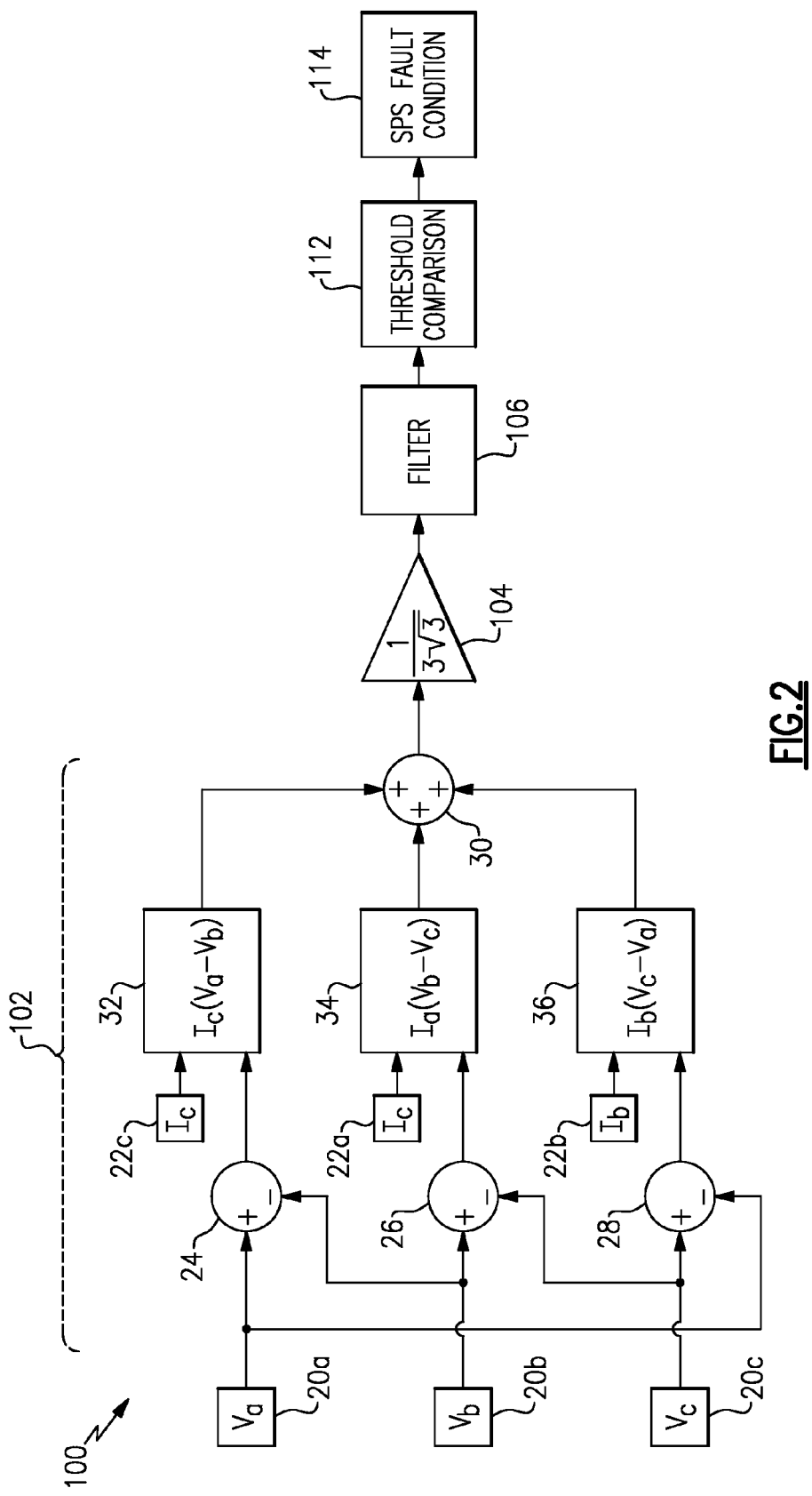
FIG. 2 schematically illustrates a method of detecting a sustained parallel source.

FIG. 2 schematically illustrates a method 100 of detecting a sustained parallel source condition. For each of the generators 12, 14, the respective controller 18a, 18b measures a voltage 20a-c and a current 22a-c for each phase of its associated generator 12, 14. Although a three phase system is illustrated in FIG. 2, it is understood that other quantities of phases could be used. The controller calculates a reactive power for each phase of current associated with the generators 12, 14 (step 102) using a plurality of summers 24, 26, 28, 30 and multipliers 32, 34, 36. The controller then calculates a three-phase average of the reactive power values (step 104) and filters the average reactive power (step 106) to produce a filtered reactive power. In one example the filtering step 106 includes applying a first filter to obtain a first filtered reactive power and applying a second filter to obtain a second filtered reactive power, with the first filter and the second filter being first order filters. In one example each of the first order filters are 50 Hertz first order filters. In one example the filtering step 106 includes applying a single second order filter. However, it is understood that other types and quantities of filters could be used. For example, third order or fourth order filters could be used.

The filtered reactive power is then compared to a predetermined threshold (step 112), and if the filtered reactive power exceeds the predetermined threshold, the controller provides a SPS fault condition notification (step 114). In one example the threshold is a negative threshold such as −50 kVAR, and to exceed the threshold the filtered reactive power would be less than −50 kVAR (such as −60 kVAR). Of course, other thresholds could be used.

Other steps may then be performed, such as actuating at least one contactor to open and resolve the parallel source condition. In one example the notification step 114 includes notifying a microprocessor or controller associated with the aircraft 10 that a SPS condition has occurred. Although an aircraft 10 has been schematically illustrated and described, it is understood that the method 100 is not limited to aircrafts and could be applied to other systems that include generators.

A threshold may be selected so that the controllers 18a, 18b can detect an SPS condition without falsely indicating a fault downstream of the generators 12, 14 as an SPS condition. For example, a feeder fault may occur somewhere in the bus network 19a, 19b that does not correspond to a SPS condition. Because feeder faults do not cause negative reactive power on all three phases of current of sufficient magnitude simultaneously, the threshold can be chosen so that the controllers 18a, 18b will not provide an SPS notification in response to a feeder fault.

Figure 3:
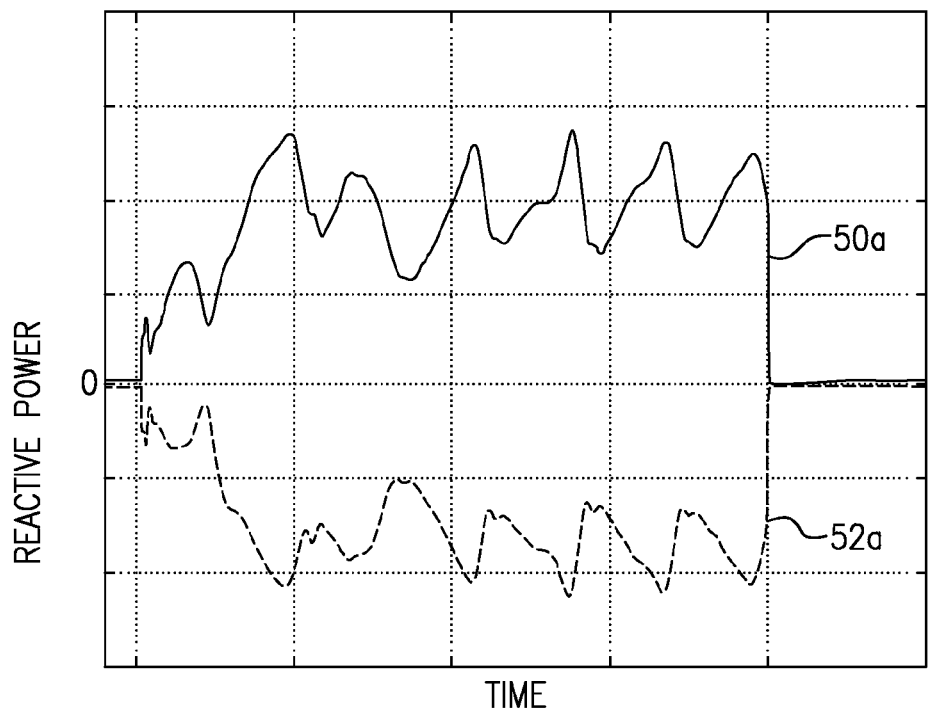
FIG. 3 illustrates a reactive power when a first generator is operating at a first rotational speed and a second generator is operating at a second rotational speed that is less than the first rotational speed.

FIG. 3 illustrates a first reactive power 50a corresponding to the first generator 12 and a second reactive power 52a corresponding to the second generator 14 when the engine 13 is operating at a first rotational speed and the engine 15 is operating at a second rotational speed that is less than the first rotational speed. As shown in FIG. 3 the first reactive power 50a is positive and the second reactive power 52a is negative, possibly indicating that the first generator and second generator have become coupled in parallel, and that the second generator 14 is being "motored" by the first generator 12 and is undesirably acting as a load on the first generator 12.

Figure 4:
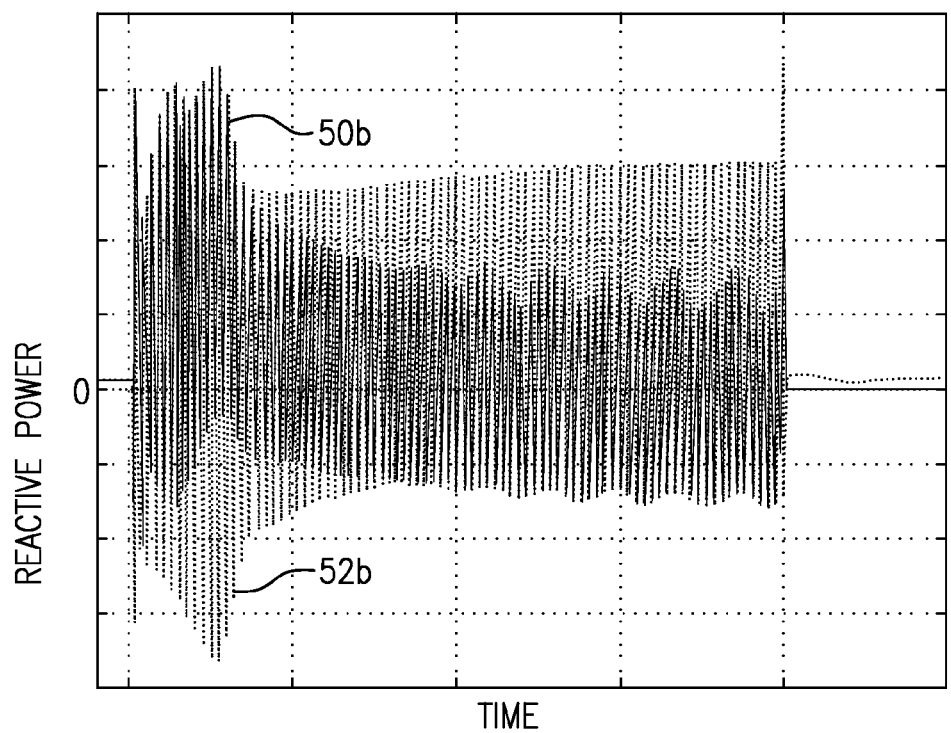
FIG. 4 illustrates a reactive power when the first generator is operating a third rotational speed and the second generator is operating at a fourth rotational speed that is less than the third rotational speed.

FIG. 4 illustrates the first reactive power 50b and the second reactive power 52b when the engine 13 is operating at a third rotational speed and the engine 15 is operating at a fourth rotational speed that is less than the third rotational speed. As shown in FIG. 4, the reactive power 50b, 52b oscillates more at the third and fourth rotational speeds than at the first and second rotational speeds.

Figure 5:
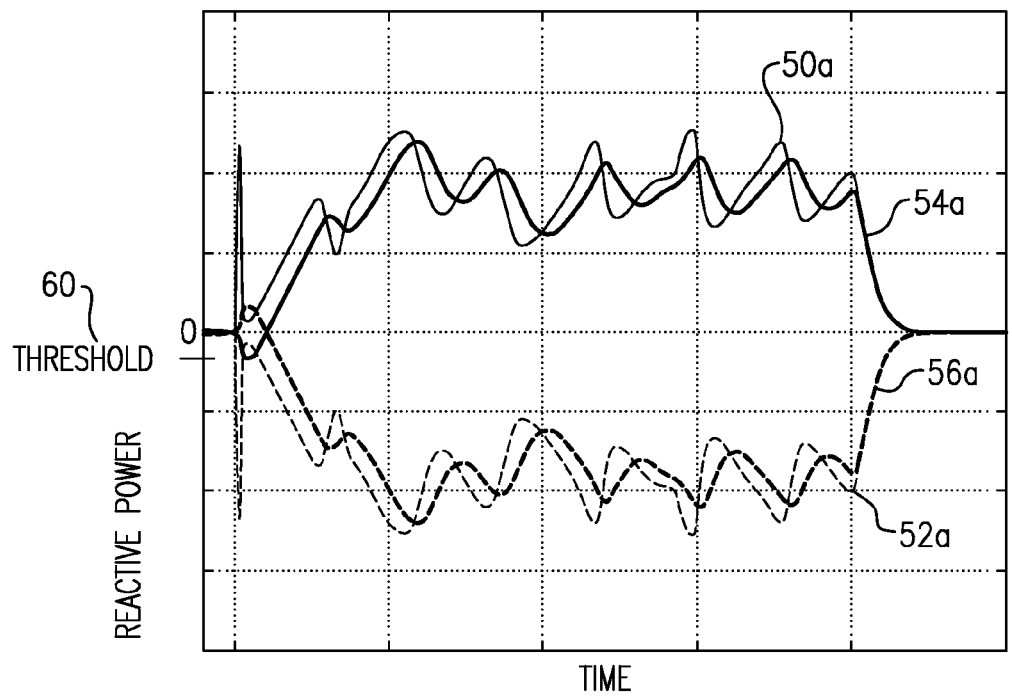
FIG. 5 illustrates the reactive power of the first generator and the second generator from FIG. 3 after being filtered.

FIG. 5 illustrates the reactive power values of FIG. 3 after being filtered. As described above, in step 106 the reactive power values 50a, 52a may be filtered. FIG. 5 accordingly illustrates a filtered reactive power 54a corresponding to the first reactive power 50a, and a filtered reactive power 56a corresponding to the second reactive power 52a. Since the filtered reactive power 56a is negative for a period of time (indicating a negative reactive power), and exceeds a threshold 60 (step 112), a SPS fault condition would be indicated (step 114).

Figure 6:
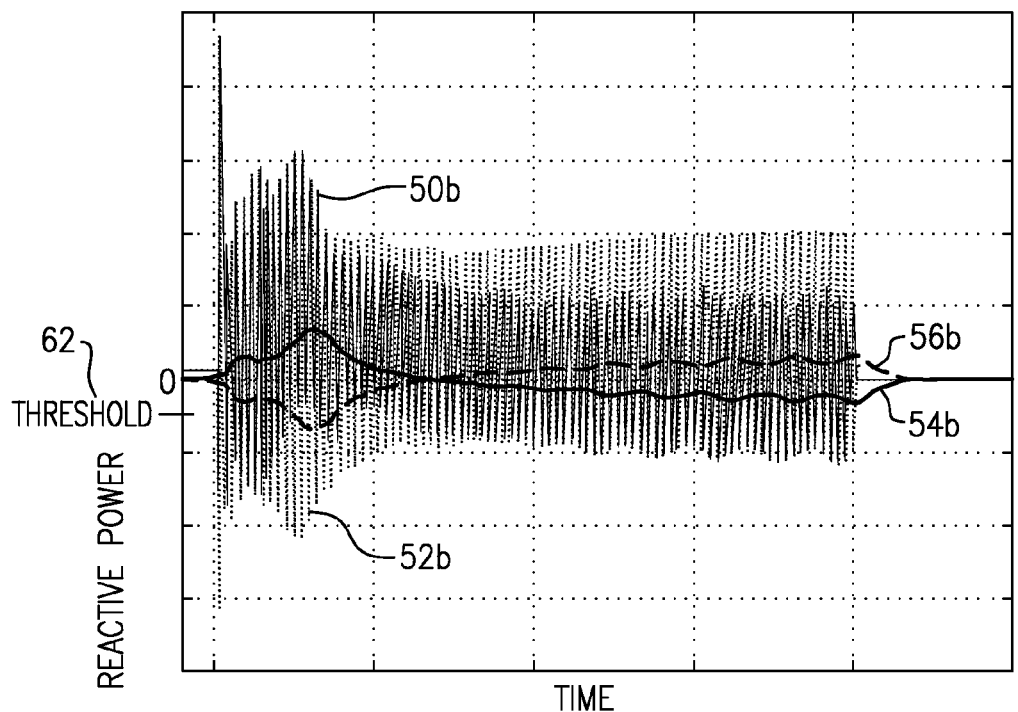
FIG. 6 illustrates the reactive power for the first generator and the second generator from FIG. 4 after being filtered.

FIG. 6 illustrates the reactive power values of FIG. 4 after being filtered. FIG. 6 illustrates a filtered reactive power 54b corresponding to the first reactive power 50b and a filtered reactive power 56b corresponding to the second reactive power 52b. Since the filtered reactive power 56b is negative for a period of time (indicating a negative reactive power), and exceeds a threshold 62 (step 112), a SPS fault condition would be indicated (step 114).

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. A method of detecting a parallel source condition comprising:
    calculating a reactive power for each of a plurality of phases of electric current;
    calculating a combined average of the reactive power values of the plurality of phases of electric current;
    comparing the combined average reactive power to a predetermined threshold;
    determining a parallel source condition in response to the combined average reactive power exceeding the predetermined threshold; and
    wherein said comparing and determining steps are performed by a controller.

2. The method of claim 1, wherein said step of calculating a reactive power for each of a plurality of phases of electric current comprises:
    calculating a first reactive power for a first phase of electric current;
    calculating a second reactive power for a second phase of electric current; and
    calculating a third reactive power for a third phase of electric current.

3. The method of claim 1, further comprising:
    filtering the combined average reactive power.

4. The method of claim 3, wherein said step of filtering the reactive power comprises:
    applying a first filter to the combined average reactive power to determine a first filtered reactive power; and
    applying a second filter to the first filtered reactive power to determine a second filtered reactive power, wherein the first filter and the second filter are first order filters.

5. The method of claim 3, wherein said step of filtering the reactive power comprises:
    applying a second order filter to the combined average reactive power to determine a filtered reactive power.

6. The method of claim 3, wherein said step of filtering the reactive power is performed by the controller.

7. The method of claim 1, further comprising:
    actuating at least one contactor to terminate the parallel source condition in response to determining a parallel source condition.

8. The method of claim 1, wherein the predetermined threshold is a negative threshold.

9. The method of claim 8, wherein the predetermined threshold is −50 kVAR.

10. The method of claim 1, wherein said step of calculating a reactive power includes sensing an output current and an output voltage of a generator.

11. The method of claim 1, wherein said steps of calculating a reactive power for each of a plurality of phases of electric current, and calculating a combined average of the reactive power values of the plurality of phases of electric current are performed by the controller.

12. The method of claim 1, wherein the predetermined threshold is constant.

13. The method of claim 1, wherein, in the parallel source condition, two generators are connected in parallel.

14. The method of claim 13, wherein the parallel source condition is caused by a contactor erroneously closing.

15. A parallel source condition detection system comprising:
    a first generator coupled to a load;
    a second generator coupled to the load;
    a controller operable to determine a reactive power associated with at least the first generator and the second generator, to calculate a combined average of the reactive power values, to compare the combined average reactive power to a predetermined threshold, and to determine a parallel source condition in response to the combined average reactive power exceeding the predetermined threshold.

16. The system of claim 15, wherein the load is associated with a vehicle.

17. The system of claim 15, wherein the controller is also operable to filter the reactive power.

18. The system of claim 15, wherein the controller is operable to calculate a first reactive power for a first phase of electric current, calculate a second reactive power for a second phase of electric current, calculate a third reactive power for a third phase of electric current, and calculate a three phase average of the first, second, and third reactive power values.

19. The system of claim 15, wherein the controller includes a digital signal processor.

20. The system of claim 15, wherein the first generator and the second generator are not connected in parallel.

21. A method of detecting a parallel source condition comprising: configuring at least two generators to power at least one load; calculating a reactive power for each of the two generators; and determining that the two generators are connected in parallel, in response to the reactive power for a first of the generators being positive over a period of time and the reactive power of a second of the generators being negative over the same period of time.

22. The method of claim 21, wherein the at least two generator generators are typically not connected in parallel.

23. The method of claim 21, wherein said step of calculating a reactive power for each of the two generators includes:
- (A) calculating a reactive power for each of a plurality of phases of current of one of the generators;
- (B) calculating a multi-phase average of the reactive power values that includes the reactive power values for each of the plurality of phases of current; and
- (C) repeating steps (A)-(B) for the other of the two generators.

\* \* \* \* \*